United States Patent
Bock

(10) Patent No.: US 7,148,462 B2
(45) Date of Patent: Dec. 12, 2006

(54) PIXEL WITH DIFFERENTIAL READOUT

(75) Inventor: Nikolai E. Bock, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/284,818

(22) Filed: Nov. 23, 2005

(65) Prior Publication Data

US 2006/0071148 A1    Apr. 6, 2006

Related U.S. Application Data

(62) Division of application No. 10/684,471, filed on Oct. 15, 2003.

(51) Int. Cl.
*H01L 27/00* (2006.01)

(52) U.S. Cl. .............. 250/214 R; 250/208.1; 348/302

(58) Field of Classification Search ............ 250/208.1, 250/214 R; 348/302, 308
See application file for complete search history.

(56) References Cited

U.S. PATENT DOCUMENTS

| | | | |
|---|---|---|---|
| 6,130,423 A * | 10/2000 | Brehmer et al. ......... | 250/208.1 |
| 6,140,630 A | 10/2000 | Rhodes | |
| 6,194,696 B1 | 2/2001 | Fossum et al. | |
| 6,204,524 B1 | 3/2001 | Rhodes | |
| 6,204,792 B1 | 3/2001 | Andersson | |
| 6,222,175 B1 | 4/2001 | Krymski | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,388,242 B1 | 5/2002 | Bock | |
| 6,646,245 B1 * | 11/2003 | Nair ..................... | 250/208.1 |
| 6,731,335 B1 * | 5/2004 | Kim et al. ............. | 348/308 |
| 6,803,952 B1 * | 10/2004 | Watanabe ............... | 348/241 |
| 6,919,549 B1 * | 7/2005 | Bamji et al. .......... | 250/208.1 |

OTHER PUBLICATIONS

Z. Zhou, et al., "A CMOS Imager with On-Chip Variable Resolution for Light-Adaptive Imaging," *IEEE* 1998.

* cited by examiner

*Primary Examiner*—Thanh X. Luu
*Assistant Examiner*—Stephen Yam
(74) *Attorney, Agent, or Firm*—Dickstein Shapiro LLP

(57) ABSTRACT

An imager in which two adjacent pixels share row and reset lines and a row selection circuitry while the output transistors of the two pixels are configured as a differential amplifier. In operation, both pixels are reset at the same time, causing differential reset signals to be output from the amplifier. The charge from the first pixel is readout and a differential pixel signal for the first pixel is output from the amplifier. Because the reset and pixel signals are differential signals generated within the pixels, they are free from common-mode noise. Correlated double sampling can be used to obtain the pixel output value, which is also free from common-mode noise, from the differential reset and pixel signals. The second pixel may be readout in the same manner. Because the two pixels are sharing circuitry, the pixels have decreased fill factor and complexity as well.

24 Claims, 7 Drawing Sheets

PIXEL WITH DIFFERENTIAL READOUT

This application is a divisional of application Ser. No. 10/684,471, filed on Oct. 15, 2003, which is hereby incorporated by reference in its entirety.

FIELD OF THE INVENTION

The invention relates generally to imaging devices, and more particularly to an imager pixel with differential readout.

BACKGROUND

Imaging devices such as complementary metal oxide semiconductor (CMOS) imagers are commonly used in photo-imaging applications. A typical CMOS imager circuit includes a focal plane array of pixel cells. Each one of the cells includes a photoconversion device or photosensor such as, for example, a photogate, photoconductor, or photodiode, for generating and accumulating photo-generated charge in a portion of the substrate of the array. A readout circuit is connected to each pixel cell and includes at least an output transistor, which receives photo-generated charges from a doped diffusion region and produces an output signal that is read-out through a pixel access transistor.

One typical CMOS imager pixel circuit, the three-transistor (3T) pixel, contains a photosensor for supplying photo-generated charge to a diffusion region; a reset transistor for resetting the diffusion region; a source follower transistor having a gate connected to the diffusion region, for producing an output signal; and a row select transistor for selectively connecting the source follower transistor to a column line of a pixel array. Another typical CMOS imager pixel employs a four-transistor (4T) configuration, which is similar to the 3T configuration, but utilizes a transfer transistor to gate charges from the photosensor to the diffusion region and the source follower transistor for output.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, all of which are assigned to Micron Technology, Inc. The disclosures of each of the forgoing are hereby incorporated by reference herein in their entirety.

FIG. 1 illustrates a typical four transistor pixel 50 utilized in CMOS imagers. The pixel 50 includes a photosensor 52 (e.g., photodiode, photogate, etc.), floating diffusion node N, transfer transistor 54, reset transistor 56, source follower transistor 58 and row select transistor 60. The photosensor 52 is connected to the floating diffusion node N by the transfer transistor 54 when the transfer transistor 54 is activated by a control signal TX. The reset transistor 56 is connected between the floating diffusion node N and an array pixel supply voltage. A reset control signal RESET is used to activate the reset transistor 56, which resets the photosensor 52 and floating diffusion node N as is known in the art.

The source follower transistor 58 has its gate connected to the floating diffusion node N and is connected between the array pixel supply voltage and the row select transistor 60. The source follower transistor 58 converts the stored charge at the floating diffusion node N into an electrical output voltage signal. The row select transistor 60 is controllable by a row select signal ROW SELECT for selectively connecting the source follower transistor 58 and its output voltage signal to a column line 62 of a pixel array.

FIG. 2 shows an exemplary CMOS imager circuit 200 that includes an array 230 of pixels (such as the pixel 50 illustrated in FIG. 1) and a timing and control circuit 232. The timing and control circuit 232 provides timing and control signals for enabling the reading out of signals from pixels of the array 230 in a manner commonly known to those skilled in the art. Exemplary arrays 230 have dimensions of M rows by N columns of pixels, with the size of the array 230 depending on a particular application.

Signals from the imager 200 are typically read out a row at a time using a column parallel readout architecture. The timing and control circuit 232 selects a particular row of pixels in the array 230 by controlling the operation of a row or vertical addressing circuit 234 and row drivers 240. Signals stored in the selected row of pixels are provided on the column lines 62 (FIG. 1) to a readout circuit 242 in the manner described above. The signal read from each of the columns is then read out sequentially using a horizontal/column addressing circuit 244. Differential pixel signals (Vrst, Vsig) corresponding to the read out reset signal and integrated pixel charge signal are provided as respective outputs Vout1, Vout2 of the readout circuit 242.

FIG. 3 more closely shows the rows and columns 349 of a typical CMOS imager 300. Each column 349 includes multiple rows of pixels 350 (such as the pixel 50 illustrated in FIG. 1). Pixel and reset signals from the pixels sensors 350 in a particular column can be read out to a readout circuit 352 associated with that column. The readout circuit 352 includes sample and hold circuitry for acquiring the pixel and reset signals. Signals stored in the readout circuits 352 are sequentially readout column-by-column onto lines 370, 372 to an output stage 354, which in the illustrated example is common to the entire array of pixels 330. The analog output signals Vout1, Vout2 may then be output, for example, to a differential analog circuit that subtracts the reset and pixel signals and sends them to an analog-to-digital converter (ADC). Alternatively, the reset and pixel signals may each be supplied to the analog-to-digital converter.

As can be seen from FIGS. 1–3, the CMOS image sensor chip normally integrates analog and digital components. As such, the analog circuitry inevitably suffers from substrate noise coupling. This is undesirable because substrate noise can compromise the signal-to-noise ratio of the imager. Substrate noise typically occurs when several circuits share the same substrate and large transient currents from some of the circuits are injected locally into the substrate through ohmic or capacitive coupling.

Differential readout, i.e., taking the difference of separately readout reset and pixel signals, is one way to reject common-mode substrate noise. In theory, any noise affecting the signals will be canceled when the signals are subtracted. Practically, however, since the reset and pixel signals are read out at different times, the noise may be different at those times. As such, the imager may still suffer from substrate noise.

One way of dealing with substrate noise is to use a dummy circuit, similar to a pixel circuit, located near the pixel circuit, but shielded from light as a reference signal source. Theoretically, the pixel and dummy circuit would see the same substrate noise, which can then be correlated by further processing. Unfortunately, the dummy circuit will cause a decreased fill factor (i.e., the ratio of light-sensitive pixel area to total pixel area) for the pixels, and for some architectures will cause an increase in KTC (thermal) noise.

Other proposed solutions include the use of complicated column and/or readout circuitry, which are also undesirable. Accordingly, there is a desire and need for an imager pixel circuit that does not suffer from substrate and other common-mode noise during a pixel readout operation, yet does not have increased complexity or fill factor.

SUMMARY

The present invention provides an imager pixel circuit that does not suffer from substrate and other common-mode noise during a pixel readout operation and does not have increased complexity or fill factor.

The above and other features and advantages are achieved in various embodiments of the invention by providing an imager in which two adjacent pixels share row and reset lines and a row selection circuit. In addition, the output transistors of the two pixels are configured as a differential amplifier. In operation, both pixels are reset at the same time, causing differential reset signals to be output from the amplifier. The charge from the first pixel is readout and a differential pixel signal for the first pixel is output from the amplifier. Because the reset and pixel signals are differential signals generated within the pixels, they are free from common-mode noise. Correlated double sampling can be used to obtain the pixel output value, which is also free from common-mode noise, from the differential reset and pixel signals. The second pixel may be readout in the same manner. Because the two pixels are sharing circuitry, the pixels have decreased fill factor and complexity as well.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention.

Figure 4:
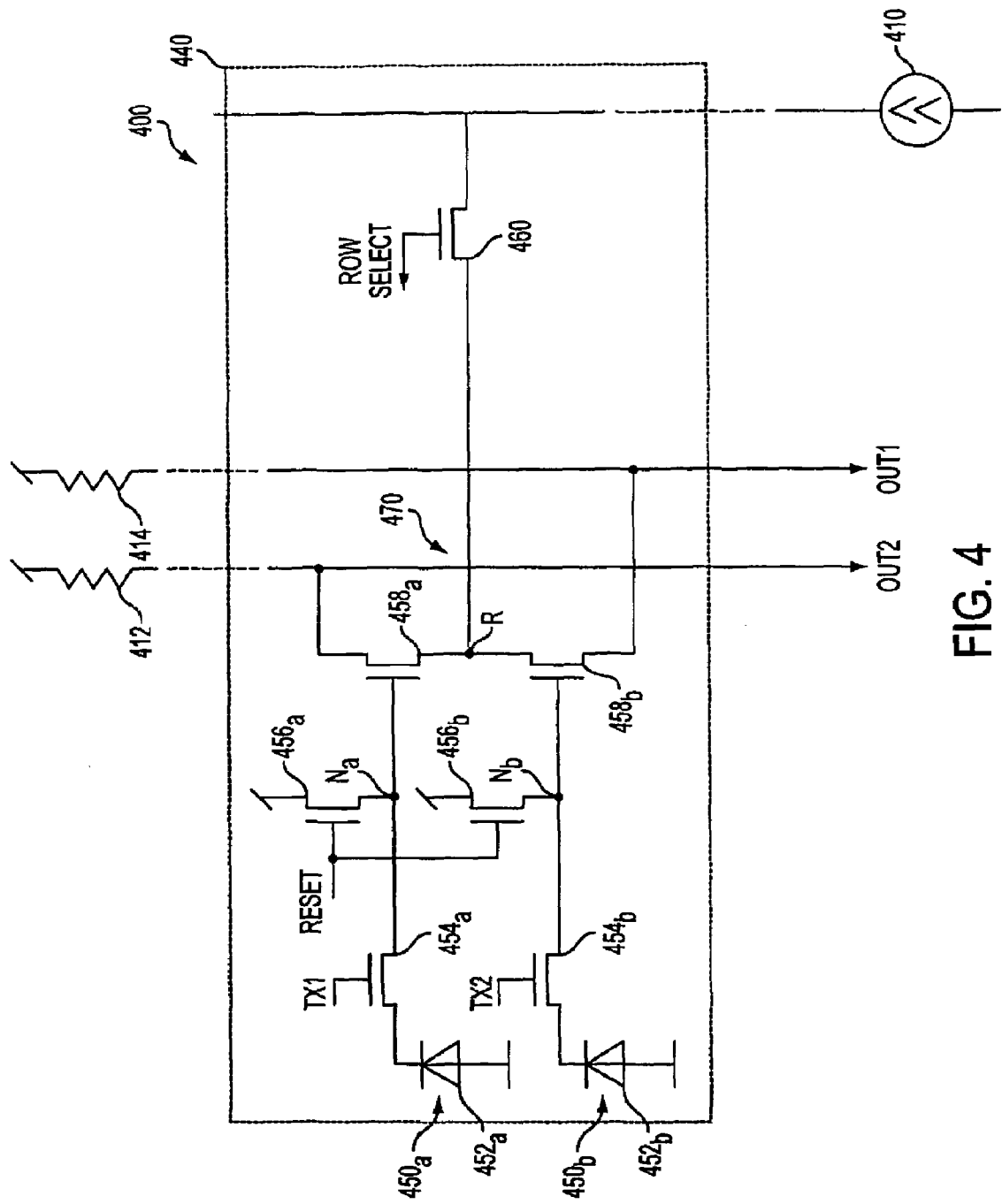
FIG. 4 is a portion of a CMOS imager constructed in accordance with an embodiment of the invention.

Now referring to the figures, where like reference numbers designate like elements, FIG. 4 shows a portion of a CMOS imager 400 constructed in accordance with an embodiment of the invention. The imager 400 includes a two pixels 450a, 450b, a tail current source 410 and two output lines out1, out2. The two output lines out1, out2 are connected to a respective load 414, 412. The two output lines out1, out 2 are also connected to the two pixels 450a, 450b. In the illustrated embodiment, the two pixels 450a, 450b are in the same column of an array, but are in adjacent rows. The two output lines out1, out2 serve as column output lines for the two pixels 450a, 450b.

The first pixel 450a includes a photosensor 452a (e.g., photodiode, photogate, etc.), floating diffusion or storage node Na, transfer transistor 454a, reset transistor 456a and a source follower transistor 458a. The photosensor 452a is connected to the floating diffusion node Na by the transfer transistor 454a when the transfer transistor 454a is activated by a first control signal TX1. The reset transistor 456a is connected between the floating diffusion node Na and an array pixel supply voltage. A shared reset control signal RESET is used to activate the reset transistor 456a, which resets the photosensor 452a and floating diffusion node Na as is known in the art. The shared reset control signal RESET is also coupled to a reset transistor 456b of the second pixel 450b (the operation of which is described below in more detail).

The source follower transistor 458a of the first pixel 450a has its gate connected to the first pixel floating diffusion node Na. The source follower transistor 458a is connected between the second output line out2 and node R connected to a shared row select transistor 460. The source follower transistor 458a converts the stored charge at the floating diffusion node Na of the first pixel into an electrical output voltage signal.

Similarly, the second pixel 450b includes a photosensor 452b (e.g., photodiode, photogate, etc.), floating diffusion or storage node Nb, transfer transistor 454b, reset transistor 456b and a source follower transistor 458b. The photosensor 452b is connected to the floating diffusion node Nb by the transfer transistor 454b when the transfer transistor 454b is activated by a second control signal TX2. The reset transistor 456b is connected between the floating diffusion node Nb and an array pixel supply voltage. The shared reset control signal RESET is used to activate the reset transistor 456b, which resets the photosensor 452b and floating diffusion node Nb as is known in the art.

The source follower transistor 458b of the second pixel 450b has its gate connected to the second pixel floating diffusion node Nb. The source follower transistor 458b is connected between the first output line out1 and node R connected to the shared row select transistor 460. The source follower transistor 458b converts the stored charge at the floating diffusion node Nb of the second pixel 450b into an electrical output voltage signal.

The row select transistor 460 is connected between the tail current source 410 and node R. The current source 410 is preferably a MOSFET operated as a current source, but may be any suitable source of current. The row select transistor 460 has its gate connected to a row select signal ROW SELECT. With the illustrated configuration, the source follower transistors 458a, 458b form a differential amplifier 470 that will provide output signals over the output lines out1, out2 that are free from substrate and other common-mode noise. For exemplary purposes only, the differential amplifier 470 is configured to have a unity gain. It should be appreciated, however, that the amplifier 470 may be configured to have positive or negative gain if so desired. The operation of the differential amplifier 470 is described below in more detail.

Furthermore, with the illustrated configuration, the two pixels 450a, 450b and the shared row select transistor 460 and shared reset RESET and row select ROW SELECT lines form a differential pixel circuit 440. Due to the shared circuitry, the imager 400 has increased fill factor because less total area of the pixel 440 is being used in the non-light sensitive portion of the pixel 440 (i.e., the ratio of light-sensitive pixel area to total pixel area is increased). The fill factor is improved because the total pixel area is decreased or, if desired, the additional area can be dedicated to the light-sensitive portion of the pixel 440. The differential pixel 440 has reduced complexity and components as well.

Figure 5:
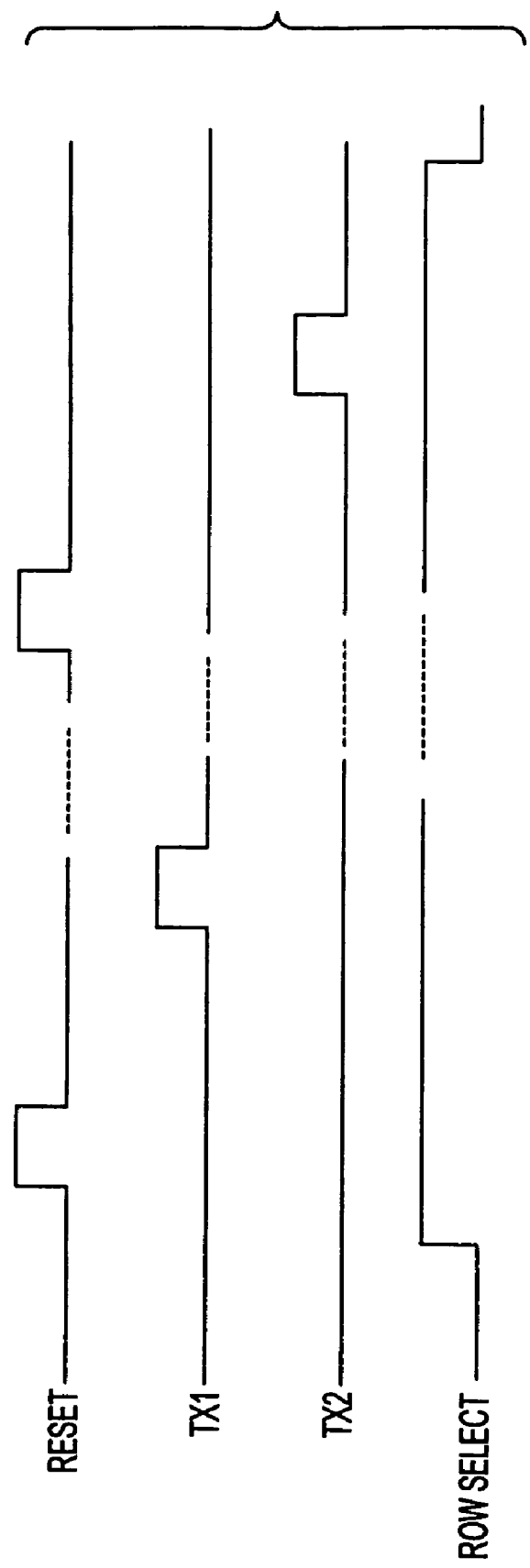
FIG. 5 is a timing diagram illustrating the operation of the FIG. 4 imager.

The operation of the imager 400 is now described with reference to FIGS. 4 and 5. When a row connected to the pixel 440 is to be read, a positive row select signal ROW SELECT is applied to the shared row select transistor 460. This activates the shared row select transistor 460, which couples the current from the tail current source 410 to the differential amplifier 470 (via node R) within the pixel 440.

A reset operation is performed on both pixel 450a, 450b by pulsing the reset signal RESET. Once the reset signal RESET is pulsed, the two reset transistors 456a, 456b are activated at the same time. This causes the two pixels 450a, 450b to be reset at the same time. The differential amplifier 470, having unity gain in the illustrated embodiment, causes the first output line out1 to carry a differential signal having a value equal to rst1−rst2, where rst1 is the reset signal of the first pixel 450a as it is applied to the first source follower transistor 458a, and rst2 is the reset signal of the second pixel 450b as it is applied to the second source follower transistor 458b. It should be appreciated that at this same time, the differential amplifier 470 causes the second output line out2 to carry a differential signal having a value equal to rst2−rst1 (described below in more detail).

Figure 1:
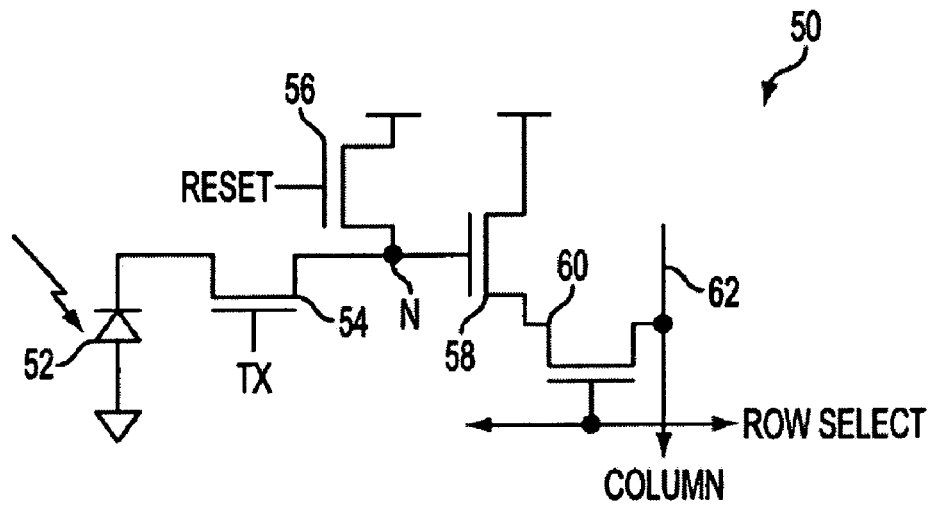
FIG. 1 is a conventional image sensor pixel.
Figure 2:
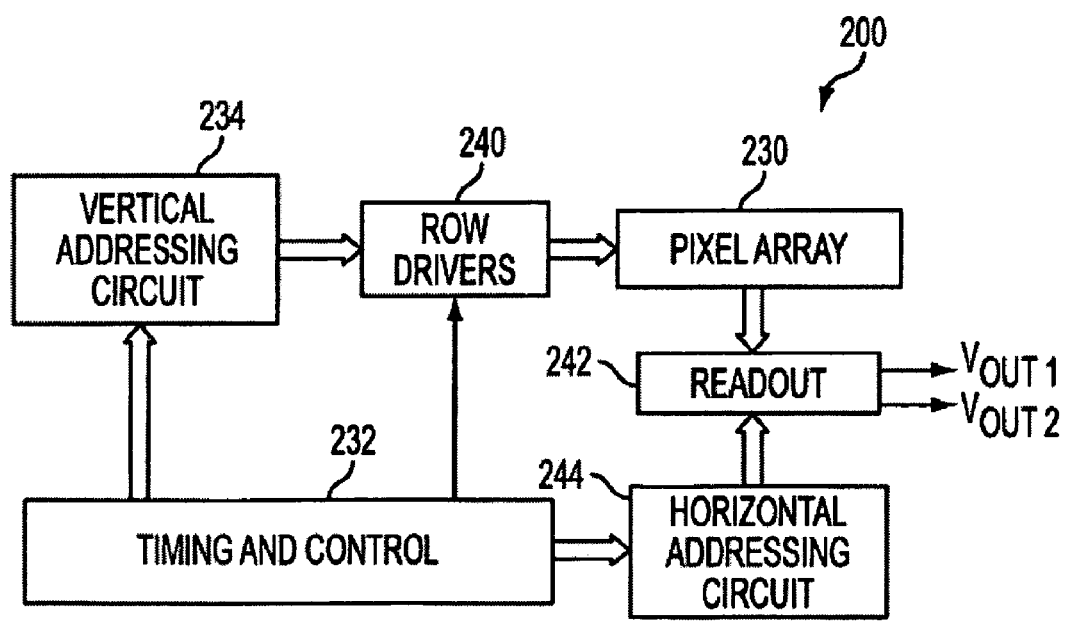
FIG. 2 is a block diagram of a conventional CMOS image sensor chip.
Figure 3:
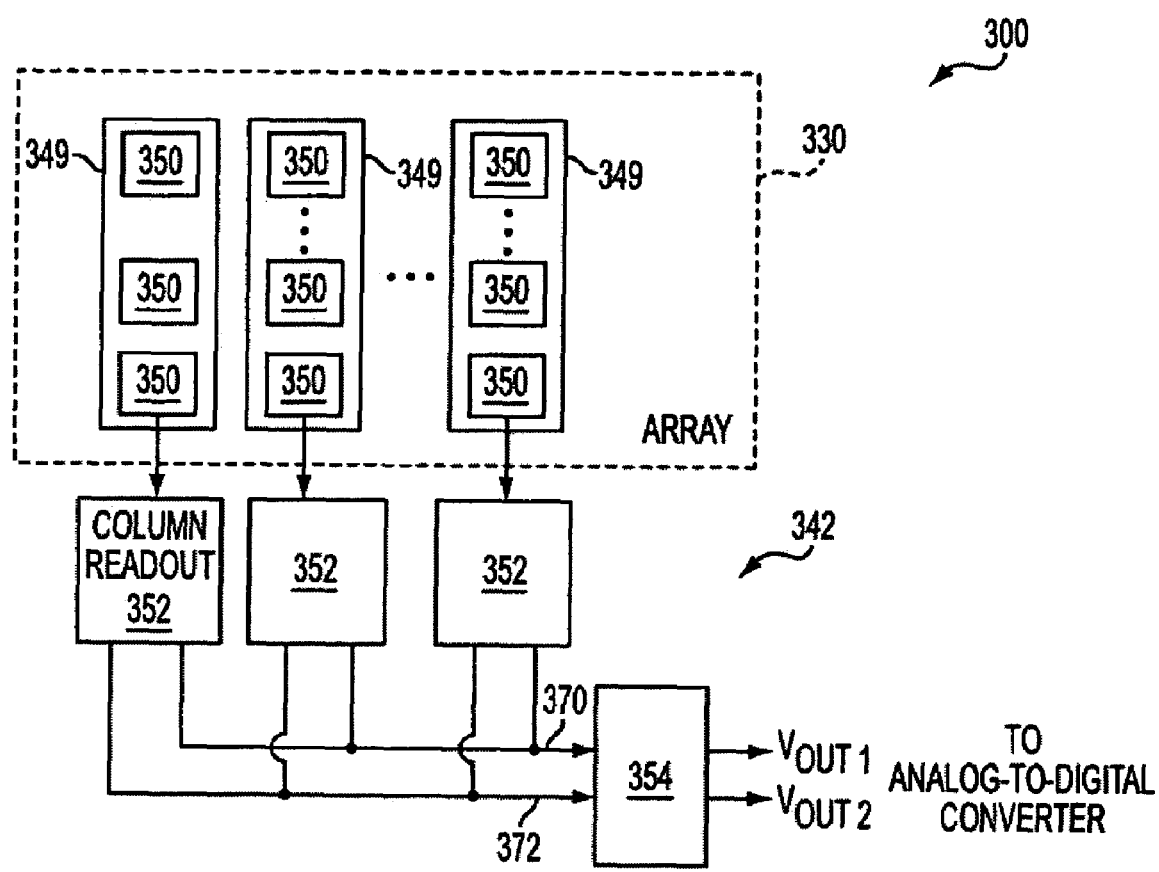
FIG. 3 is a block diagram of a conventional array of active pixels and associated readout circuitry.

Once the two pixels 450a, 450b are reset and the differential output of the first output line out1 is sampled (by subsequent sample and hold circuitry e.g., readout circuit 352 illustrated in FIG. 3), the first control signal TX1 is pulsed to activate the first transfer transistor 454a. The activation of the first transfer transistor 454a causes the charge stored in the photosensor 452a of the first pixel 450a to be transferred to the floating diffusion node Na and applied to the first source follower transistor 458a. The differential amplifier 470, having unity gain in the illustrated embodiment, causes the first output line out1 to carry a differential signal having a value equal to sig1−rst2, where sig1 is the pixel signal of the first pixel 450a as it is applied to the first source follower transistor 458a, and rst2 is the reset signal of the second pixel 450b as it is applied to the second source follower transistor 458b.

This second differential output from the first output line out1 is sampled by sample and hold circuitry (e.g., readout circuit 352 illustrated in FIG. 3). Correlated double sampling is then performed to obtain the difference between the two differential outputs, which is rst1−rst2−(sig1−rst2) or rst1−sig1. Thus, the first pixel 450a is readout using two differential signals, which are free from substrate and other common-mode noise. As such, the correlated double sampled result (i.e., rst1−sig1) is also free from substrate and other common-mode noise typically found in conventional imagers.

After some row processing time, the second pixel 450b is readout in a similar manner. For example, the second pixel 450b having already been reset, can have the charge stored in its photosensor 452b transferred to its floating diffusion node Nb by pulsing the second control signal TX2. The pulsing of the second control signal TX2 activates the second transfer transistor 454a, which causes the charge stored in the photosensor 452b to be transferred to the floating diffusion node Nb and applied to the second source follower transistor 458b. The differential amplifier 470, having unity gain in the illustrated embodiment, causes the second output line out2 to carry a differential signal having a value equal to sig2−rst1, where sig2 is the pixel signal of the second pixel 450b as it is applied to the second source follower transistor 458b, and rst1 is the reset signal of the first pixel 450a as it is applied to the first source follower transistor 458a.

This second differential output from the second output line out2 is sampled by sample and hold circuitry (e.g., readout circuit 352 illustrated in FIG. 3). Correlated double sampling is then performed to obtain the difference between the two differential outputs, which is rst2−rst1−(sig2−rst1) or rst2−sig2. Thus, the second pixel 450b is readout using two differential signals, which are free from substrate and other common-mode noise. As such, the correlated double sampled result (i.e., rst2−sig) is also free from substrate and other common-mode noise typically found in conventional imagers.

The differential pixel 440 of the invention has been illustrated as containing two pixels 450a, 450b that share the row select transistor 460 and utilize the same row select and reset lines. It should be appreciated that the differential pixel of the invention could include more than two pixels. By using more than two pixels and the shared row select and reset circuitry, the differential pixel will have a fill factor that is much greater than a fill factor of a typical imager pixel and that of the pixel 440 illustrated in FIG. 4.

Figure 6:
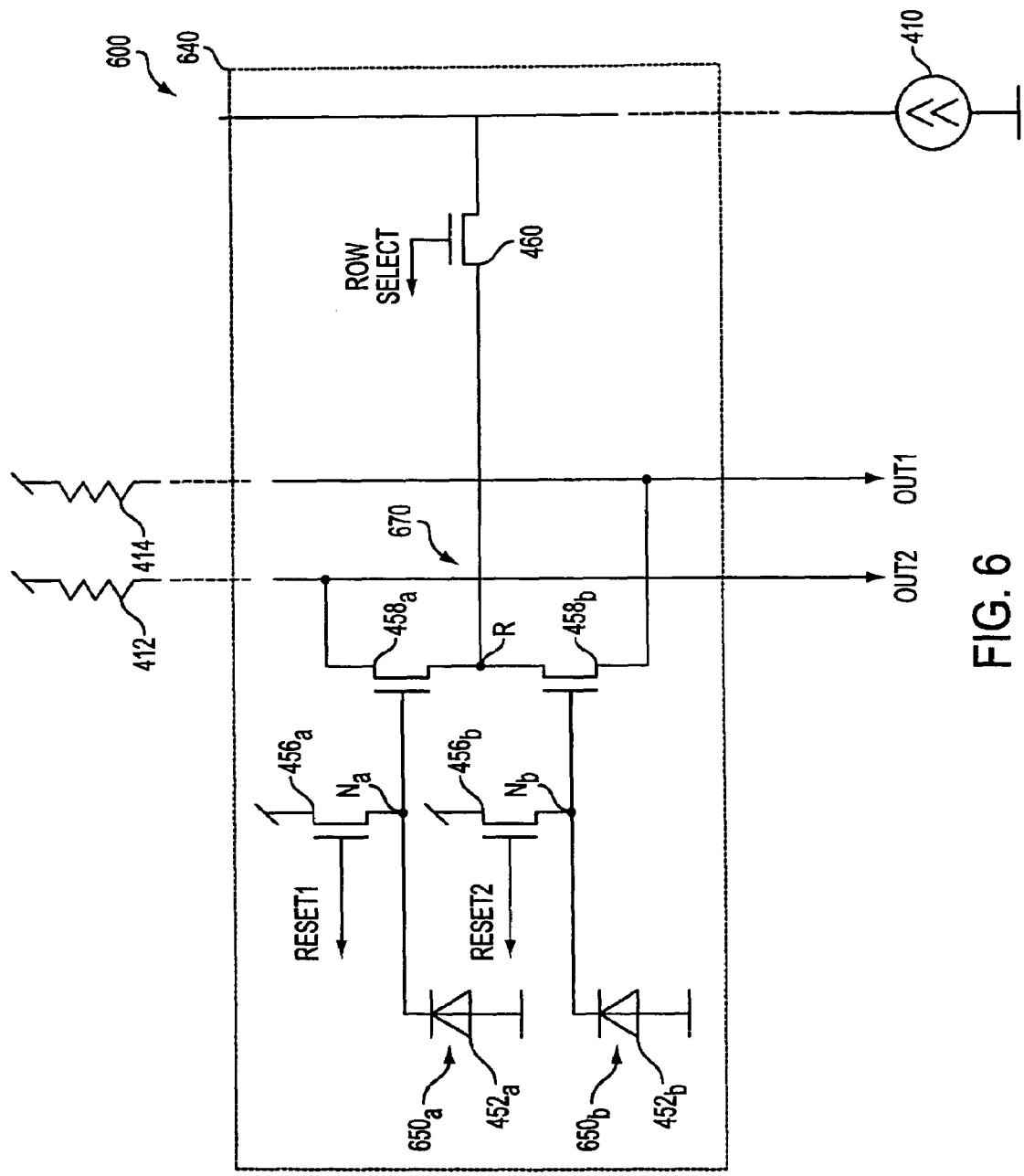
FIG. 6 is a portion of a CMOS imager constructed in accordance with another embodiment of the invention.

It should be noted that the invention has been described with reference to four-transistor (4T) pixels utilizing a transfer transistor. It should be understood that the invention may utilize a three transistor (3T) pixel, without the use of a transfer transistor. FIG. 6 is one example of a CMOS imager 600 constructed with 3T pixel circuits 650a, 650b in accordance with an embodiment of the invention. The remaining circuitry is substantially the same as the circuitry of imager 400 illustrated in FIG. 4 except that the two reset transistors 456a, 456b are connected to receive respective reset signals RESET1, RESET2.

Figure 7:
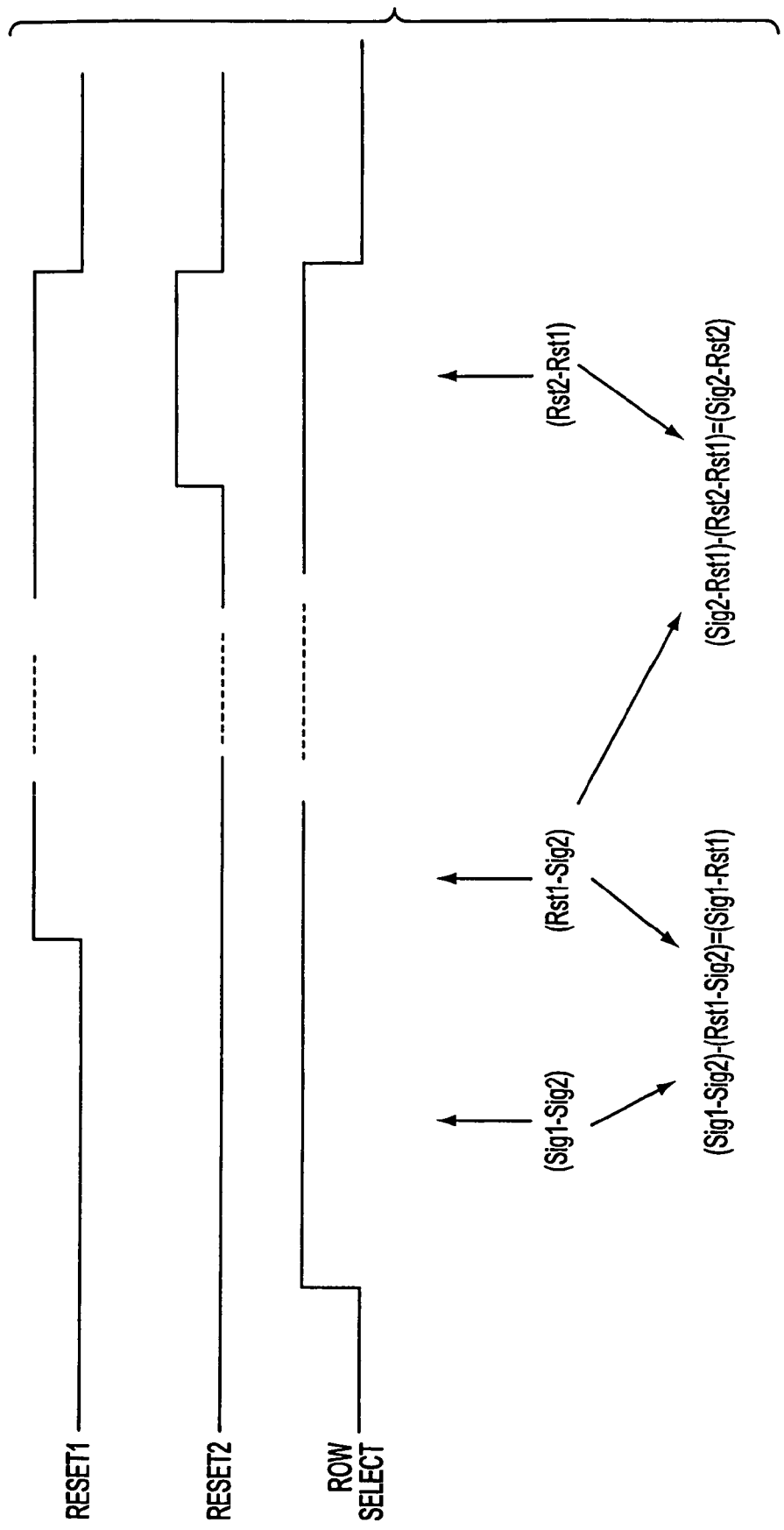
FIG. 7 is a timing diagram illustrating the operation of the FIG. 6 imager.

The operation of the imager 600 is now described with reference to FIGS. 6 and 7. When a row connected to the pixel 640 is to be read, a positive row select signal ROW SELECT is applied to the shared row select transistor 460. This activates the shared row select transistor 460, which couples the current from the tail current source 410 to the differential amplifier 670 (via node R) within the pixel 440. At this point, the differential amplifier 670, having unity gain in the illustrated embodiment, causes the first output line out1 to carry a differential signal having a value equal to sig1−sig2. It should be appreciated that at this same time, the differential amplifier 670 causes the second output line out2 to carry a differential signal having a value equal to sig2−sig1. sig2−sig1 is sampled by the column sample and hold circuitry.

A reset operation is performed on the first pixel 450a by pulsing the first reset signal RESET1. Once the first reset signal RESET1 is pulsed, the first pixel 450a is reset. The differential amplifier 670, having unity gain in the illustrated embodiment, causes the first output line out1 to carry a differential signal having a value equal to rst1−sig2. This second differential output from the first output line out1 is sampled by sample and hold circuitry (e.g., readout circuit 352 illustrated in FIG. 3). The same time sig2–rst1 is sampled by another sample and hold circuit. Correlated double sampling is then performed to obtain the difference between the two differential outputs, which is (sig1–sig2)–(rst1–sig2) or sig1–rst1.

After some row processing time, the second pixel 450b is readout in a similar manner. sig2–rst1 is already stored in the column circuitry. Now a reset operation is performed on the second pixel 450b by pulsing the second reset signal RESET2. Once the second reset signal RESET2 is pulsed, the second pixel 450b is reset. The differential amplifier 670, having unity gain in the illustrated embodiment, causes the second output line out2 to carry a differential signal having a value equal to rst2–rst1. This second differential output from the second output line out2 is sampled by sample and hold circuitry (e.g., readout circuit 352 illustrated in FIG. 3). Correlated double sampling is then performed to obtain the difference between the two differential outputs, which is (sig2–rst1)–(rst2–rst1) or sig2–rst2.

Figure 8:
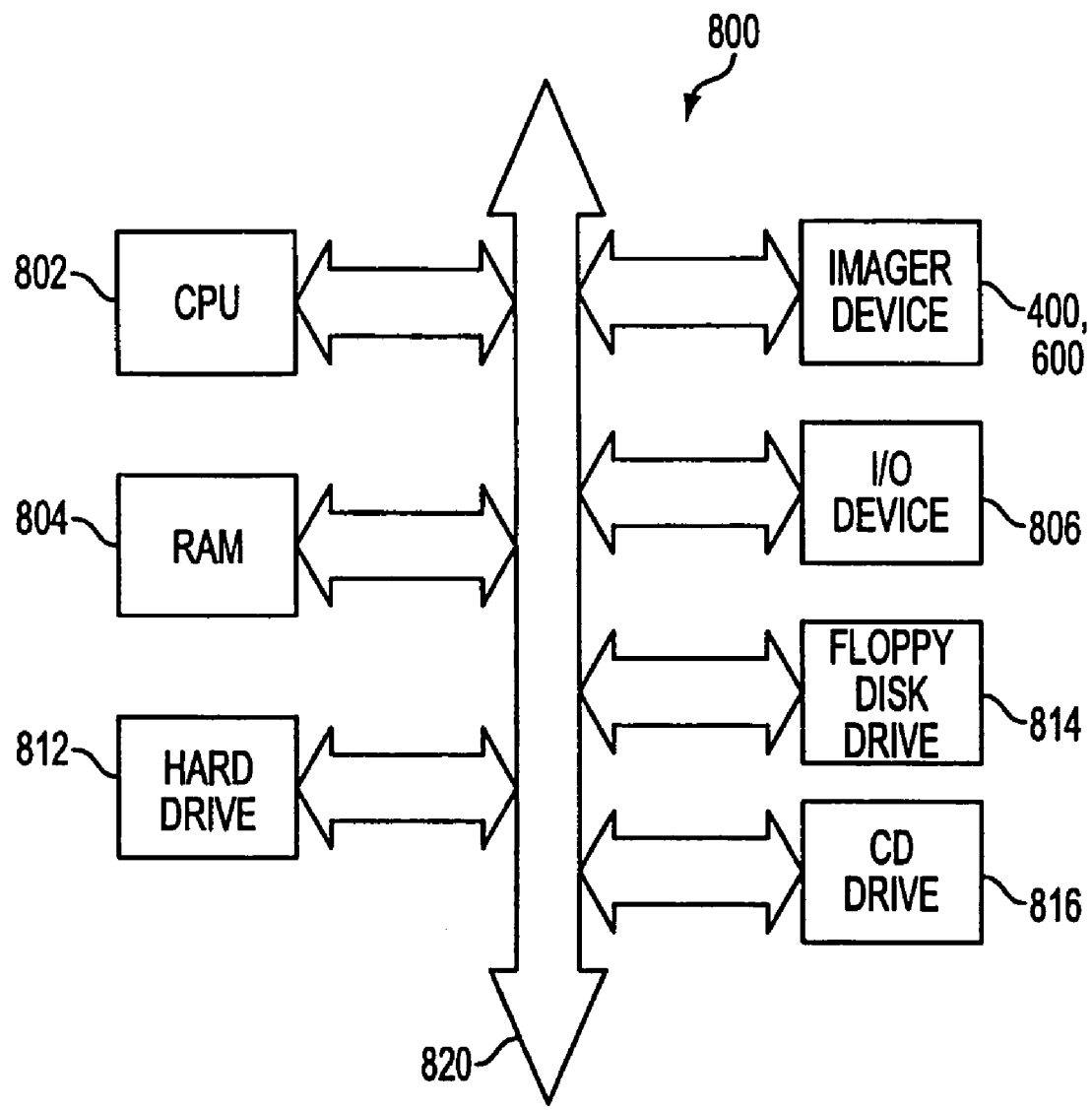
FIG. 8 shows a processor system incorporating at least one CMOS imager device constructed in accordance with an embodiment of the invention.

FIG. 8 shows system 800, a typical processor system modified to include an imager device 400 (FIG. 4), 600 (FIG.6) of the invention. Examples of processor systems, which may employ the imager device 400, 600, include, without limitation, computer systems, camera systems, scanners, machine vision systems, vehicle navigation systems, video telephones, surveillance systems, auto focus systems, star tracker systems, motion detection systems, image stabilization systems, and others.

System 800 includes a central processing unit (CPU) 802 that communicates with various devices over a bus 820. Some of the devices connected to the bus 820 provide communication into and out of the system 800, illustratively including an input/output (I/O) device 806 and imager device 400, 600. Other devices connected to the bus 820 provide memory, illustratively including a random access memory (RAM) 804, hard drive 812, and one or more peripheral memory devices such as a floppy disk drive 814 and compact disk (CD) drive 816. The imager device 400, 600 may be combined with a processor, such as a CPU, digital signal processor, or microprocessor, in a single integrated circuit.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An imager device comprising:
   a plurality of differential pixels organized as an array having rows and columns; and
   a plurality of output lines coupled to said differential pixels, each pixel outputting differential reset signals and differential pixel signals on a respective output line, wherein each differential pixel comprises:
   a plurality of photosensors,
   a plurality of transfer transistors, each transfer transistor connected to and transferring charge from a respective photosensor,
   a plurality of storage nodes, each node being coupled to a respective transfer transistor and storing charge transferred by a respective one of said plurality of photosensors, and
   a differential amplifier connected to said storage nodes and outputting a plurality of differential signals for each photosensor, said differential amplifier comprises two source follower transistors, each source follower transistor having a gate terminal connected to a respective storage node, a first source/drain terminal connected to one of said plurality of output lines, and a second source/drain terminal connected to a second node.

2. The imager device of claim 1, wherein said differential amplifier is coupled to a respective plurality of said output lines.

3. The imager device of claim 2, wherein said output lines coupled to said differential amplifier are also electrically coupled to respective loads.

4. The imager device of claim 1 further comprising:
   a row select transistor; and
   a current source, said row select transistor being coupled between said second node and said current source, said row select transistor causing the current source to be connected to said second node when activated.

5. The imager device of claim 4 further comprising a plurality of reset transistors, each reset transistor being coupled between a reset voltage source and a respective storage node, said reset transistors being activated by a shared reset control signal such that each reset transistor is activated at a same time.

6. The imager device of claim 1, wherein said plurality of transfer transistors are activated in sequence such that charges from said plurality of photosensors are transferred to said amplifier in a sequential manner.

7. The imager device of claim 1 further comprising a plurality of reset transistors, each reset transistor being coupled between a reset voltage source and a respective storage node, said reset transistors being activated by a shared reset control signal such that each reset transistor is activated at a same time.

8. The imager device of claim 7, wherein said differential amplifier outputs a first differential signal on a first output line, said first differential signal comprising a difference between a plurality of reset voltage signals input from said storage nodes.

9. The imager device of claim 8, wherein said differential amplifier outputs a second differential signal on the first output line, said second differential signal comprising a difference between a pixel voltage signal input from a first storage node and a reset voltage signal input from a second storage node.

10. The imager device of claim 8, wherein said differential amplifier outputs a second differential signal on a second output line, said second differential signal comprising a difference between a plurality of reset voltage signals input from said storage nodes.

11. The imager device of claim 10, wherein said differential amplifier outputs a third differential signal on the second output line, said third differential signal comprising a difference between a pixel voltage signal input from a first storage node and a reset voltage signal input from a second storage node.

12. A processor system comprising:
   an imager device comprising:
   a plurality of differential pixels organized as an array having rows and columns;

a plurality of output lines coupled to said differential pixels, each pixel outputting differential reset signals and differential pixel signals on a respective output line, wherein each differential pixel comprises:

a plurality of photosensors, a plurality of transfer transistors, each transfer transistor connected to and transferring charge from a respective photosensor, a plurality of storage nodes, each node being coupled to a respective transfer transistor and storing charge transferred by a respective one of said plurality of photosensors; and a differential amplifier connected to said storage nodes and outputting a plurality of differential signals for each photosensor, said differential amplifier comprises two source follower transistors, each source follower transistor having a gate terminal connected to a respective storage node, a first source/drain terminal connected to one of said plurality of output lines, and a second source/drain terminal connected to a second node.

13. The system of claim 12, wherein said differential amplifier is coupled to a respective plurality of said output lines.

14. The system of claim 13, wherein said output lines coupled to said differential amplifier are also electrically coupled to respective loads.

15. The system of claim 12, wherein said imager device further comprises:

a row select transistor; and a current source, said row select transistor being coupled between said second node and said current source, said row select transistor causing the current source to be connected to said second node when activated.

16. The system of claim 15, wherein said imager device further comprises a plurality of reset transistors, each reset transistor being coupled between a reset voltage source and a respective storage node, said reset transistors being activated by a shared reset control signal such that each reset transistor is activated at a same time.

17. The system of claim 16, wherein said plurality of transfer transistors are activated in sequence such that charges from said plurality of photosensors are transferred to said amplifier in a sequential manner.

18. The system of claim 16, wherein said imager device further comprises a plurality of reset transistors, each reset transistor being coupled between a reset voltage source and a respective storage node, said reset transistors being activated by a shared reset control signal such that each reset transistor is activated at a same time.

19. The system of claim 12, wherein said differential amplifier outputs a first differential signal on a first output line, said first differential signal comprising a difference between a plurality of reset voltage signal input from said storage nodes.

20. The system of claim 19, wherein said differential amplifier outputs a second differential signal on the first output line, said second differential signal comprising a difference between a pixel voltage signal input from a first storage node and a reset voltage signal input from a second storage node.

21. The system of claim 19, wherein said differential amplifier outputs a second differential signal on a second output line, said second differential signal comprising a difference between a plurality of reset voltage signals input from said storage nodes.

22. The system of claim 21, wherein said differential amplifier outputs a third differential signal on the second output line, said third differential signal comprising a difference between a pixel voltage signal input from a first storage node and a reset voltage signal input from a second storage node.

23. An imager device comprising:

a plurality of differential pixels organized as an array having rows and columns; and a plurality of output lines coupled to said differential pixels, each pixel outputting differential reset signals and differential pixel signals on a respective output line, wherein each differential pixel comprises:

a plurality of photosensors, a plurality of transfer transistors, each transfer transistor connected to and transferring charge from a respective photosensor, a plurality of storage nodes, each node being coupled to a respective transfer transistor and storing charge transferred by a respective one of said plurality of photosensors, a differential amplifier connected to said storage nodes and outputting a plurality of differential signals for each photosensor, and a plurality of reset transistors, each reset transistor being coupled between a reset voltage source and a respective storage node, said reset transistors being activated by a shared reset control signal such that each reset transistor is activated at a same time, wherein said differential amplifier outputs a first differential signal on a first output line, said first differential signal comprising a difference between a plurality of reset voltage signals input from said storage nodes and said differential amplifier outputs a second differential signal on the first output line, said second differential signal comprising a difference between a pixel voltage signal input from a first storage node and a reset voltage signal input from a second storage node.

24. An imager device comprising:

a plurality of differential pixels organized as an array having rows and columns; and a plurality of output lines coupled to said differential pixels, each pixel outputting differential reset signals and differential pixel signals on a respective output line, wherein each differential pixel comprises:

a plurality of photosensors, a plurality of transfer transistors, each transfer transistor connected to and transferring charge from a respective photosensor, a plurality of storage nodes, each node being coupled to a respective transfer transistor and storing charge transferred by a respective one of said plurality of photosensors, a differential amplifier connected to said storage nodes and outputting a plurality of differential signals for each photosensor, and a plurality of reset transistors, each reset transistor being coupled between a reset voltage source and a respective storage node, said reset transistors being activated by a shared reset control signal such that each reset transistor is activated at a same time, wherein said differential amplifier outputs a first differential signal on a first output line, said first differential signal comprising a difference between a plurality of reset voltage signals input from said storage nodes, said differential amplifier outputs a second differential signal on a second output line, said second differential signal comprising a difference between a plurality of reset voltage signals input from said storage nodes and said differential amplifier outputs a third differential signal on the second output line, said third differential signal comprising a difference between a pixel voltage signal input from a first storage node and a reset voltage signal input from a second storage node.

* * * * *